United States Patent
Kim et al.

(10) Patent No.: US 7,489,262 B2
(45) Date of Patent: Feb. 10, 2009

(54) DIGITAL TO ANALOG CONVERTER HAVING INTEGRATED LEVEL SHIFTER AND METHOD FOR USING SAME TO DRIVE DISPLAY DEVICE

(75) Inventors: Cheol-Min Kim, Seoul (KR); Il-Gon Kim, Seoul (KR); Gi-Chang Lee, Seoul (KR); Yang-Hwa Choi, Yongin-si (KR); Oh-Kyong Kwon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/728,903

(22) Filed: Mar. 27, 2007

(65) Prior Publication Data

US 2007/0241952 A1 Oct. 18, 2007

(51) Int. Cl.
*H03M 1/66* (2006.01)
(52) U.S. Cl. ............... 341/144; 341/154; 341/142; 345/87; 345/89; 345/94; 345/211
(58) Field of Classification Search ......... 341/144–154; 345/87, 89, 94–97, 204–210
See application file for complete search history.

(56) References Cited

U.S. PATENT DOCUMENTS

| | | | | |
|---|---|---|---|---|
| 5,414,443 A | * | 5/1995 | Kanatani et al. | 345/95 |
| 5,945,972 A | * | 8/1999 | Okumura et al. | 345/98 |
| 5,973,660 A | * | 10/1999 | Hashimoto | 345/98 |
| 6,043,998 A | | 3/2000 | Hirashima et al. | |
| 6,191,779 B1 | | 2/2001 | Taguchi et al. | |
| 6,657,648 B1 | * | 12/2003 | Aoki | 345/204 |
| 7,129,936 B2 | * | 10/2006 | Aoki | 345/204 |
| 7,224,336 B2 | * | 5/2007 | Katsutani | 345/87 |

(Continued)

FOREIGN PATENT DOCUMENTS

EP 0 837 445 A1 4/1998

(Continued)

OTHER PUBLICATIONS

Patent Abstracts of Japan, Publication No. 10-003285, Jan. 6, 1998, 1 page.

(Continued)

*Primary Examiner*—Linh V Nguyen
(74) *Attorney, Agent, or Firm*—MacPherson Kwok Chen & Heid LLP

(57) ABSTRACT

A digital-to-analog converter (DAC) includes a decoder unit for receiving an external digital data signal operating over a first predefined voltage range (i.e., 0-5V); a resistor array for generating a plurality of gray voltages defined across a second voltage range that is substantially wider than the first predefined voltage range, and a voltage selecting unit for selecting one of the gray voltages based on an output of the decoder unit, wherein the decoder unit includes a plurality of decoder stages and first and second boost circuits for generating output signals operating over a third voltage range (i.e., 0-7V) that is substantially wider than the first predefined voltage range while not requiring an additional power supply for producing voltages of the third voltage range (i.e., 0-7V).

23 Claims, 11 Drawing Sheets

U.S. PATENT DOCUMENTS

| | | | |
|---|---|---|---|
| 7,239,300 B2 * | 7/2007 | Shimizu | 345/100 |
| 7,283,105 B2 * | 10/2007 | Dallas et al. | 345/32 |
| 2001/0030645 A1 | 10/2001 | Tsutsui et al. | |
| 2003/0142051 A1 * | 7/2003 | Katsutani | 345/87 |
| 2004/0066382 A1 * | 4/2004 | Aoki | 345/204 |
| 2004/0189579 A1 * | 9/2004 | Shimizu | 345/98 |
| 2005/0057231 A1 | 3/2005 | Morita | |

FOREIGN PATENT DOCUMENTS

| | | |
|---|---|---|
| EP | 1 225 557 A1 | 7/2002 |
| JP | 10-003285 | 1/1998 |
| JP | 11-030974 | 2/1999 |
| JP | 2002-171158 | 6/2002 |
| JP | 2003-233350 | 8/2003 |
| KR | 10-0319605 | 12/2001 |
| KR | 10-0324048 | 1/2002 |
| KR | 10-0421873 | 2/2004 |
| KR | 10-0422593 | 3/2004 |
| KR | 2005-0060230 | 6/2005 |
| KR | 10-0515288 | 9/2005 |
| WO | 2004/097506 | 11/2004 |

OTHER PUBLICATIONS

Patent Abstracts of Japan, Publication No. 11-030974, Feb. 2, 1999, 1 page.
Patent Abstracts of Japan, Publication No. 2002-171158, Jun. 14, 2002, 1 page.
Patent Abstracts of Japan, Publication No. 2003-233350, Aug. 22, 2003, 1 page.
English Language Abstract, KR Patent No. 10-0319605, Dec. 20, 2001, 1 page.
English Language Abstract, KR Patent No. 10-0421873, Feb. 25, 2004, 1 page.
English Language Abstract, KR Patent No. 10-0422593, Mar. 2, 2004, 1 page.
English Language Abstract, KR Patent No. 10-0515288, Sep. 8, 2005, 1 page.
English Language Abstract, KR Patent First Publication No. 2005-0060230, Jun. 22, 2005, 1 page.
Oh-Kyong Kwon et al: "66.4: Invited Paper: Technical Issues on Large-Size, High-Resolution and High-Gray-Scale TFT-LCDs".
Search Report dated Jul. 5, 2007 from European Patent Application corresponding to U.S. Appl. No. 11/728,903.

* cited by examiner

DIGITAL TO ANALOG CONVERTER HAVING INTEGRATED LEVEL SHIFTER AND METHOD FOR USING SAME TO DRIVE DISPLAY DEVICE

CROSS-REFERENCE TO RELATED APPLICATION

This application claims priority to and the benefit of Korean Patent Application No. 10-2006-0034901 filed in the Korean Intellectual Property Office on Apr. 18, 2006, the entire disclosure of which is incorporated herein by reference.

BACKGROUND (a) Field of Invention

The present disclosure of invention relates to digital-to-analog converters (DAC) and particularly to those used for receiving digital input signals operating at a first voltage range and outputting corresponding analog signals to display devices such as Liquid Crystal Displays (LCD's) operating across a wider second voltage range.

(b) Description of Related Art

Recently, flat panel displays such as organic light emitting devices (OLED's), plasma display devices (PDP's), liquid crystal display (LCD's), etc., have been actively developed for replacing the conventionally heavy and large cathode ray tube (CRT) as a form of display, particularly in digital display applications.

The typical PDP uses plasma generated light based on electrically driven gas discharge for displaying characters or images. The typical OLED displays characters or images by using field emission of a particular organic material or polymer. In the LCD, an electrical field is applied to a liquid crystal layer interposed between two display substrates, and transmittance of light passing through the liquid crystal layer is controlled by controlling strength of an electrical field between the substrates to thus obtain a desired image. Voltages used in each of these applications varies according to the underlying technology and according to the interface technologies used for interfacing control electronics (i.e., logic) with drive electronics (i.e., output buffers).

Among the above mentioned flat panel displays, the LCD and the OLED for example, typically include a display substrate on which pixel areas are formed to include switching elements (i.e., thin film transistors) and display signal lines. The typical flat panel also includes a gate-lines driver for transmitting binary gate signals to gate lines that are provided crossing with the display signal lines for turning the switching elements of the pixel areas on or off. The typical flat panel also includes a gray voltages generator for generating a plurality of gray level analog voltages to be used for driving pixel areas at different light intensities. The typical flat panel also includes a data driver for selecting voltages corresponding to video data among the gray voltages as data voltages and applying the selected data voltages to the data lines, and a signal controller for controlling them.

The data driver typically includes a plurality of data driving ICs, and each data driving IC (monolithic integrated circuit) includes a shift register, a latch, a digital-to-analog converter (DAC), and an output buffer.

The typical DAC may convert a digital data signal operating at a first voltage range (i.e., 0-5 volts) into an analog data signal operating across a second and different voltage range (usually larger, i.e., 0-10 volts) by using at least two different power supplies for providing respective low and high power voltages, VDD and VDDH for the digital logic and digital drive circuits. Yet a third power supply is typically provided for supplying the analog voltages used in directly driving the display mechanism (e.g., LCD or PDP). In respect to providing interfacing between logic signaling that operates from the first power voltage, VDD and drive signaling that typically operates from the second and higher power voltage, VDDH, such typically requires use of a DC-to-DC converter type of power supply that generates the second higher power supply voltage, VDDH from the first VDD. It additionally calls for level shifting circuits for converting digital signals operating in the first signaling range (i.e., 0-5V) to the second one (i.e., 0-10V). Use of such additional circuits may lead to an increase in area used by the logic and driving circuits and an increase in power consumption.

SUMMARY

The present disclosure of invention provides a DAC that has an integrated level shifter and does not require a separate DC/DC power supply converter for generating the higher digital drive voltages.

An exemplary embodiment of such a digital-to-analog converter (DAC) comprises: a decoder unit for receiving an external data signal operating at a first signaling range of voltages; a resistors array for generating or defining a plurality of different gray voltages; and a voltage selecting unit for selecting one of the gray voltages based on an output of the decoder unit, wherein the decoder unit includes a plurality of decoders each having first and second boost circuits for generating an output of boosted voltage level while using a power supply of lower voltage (VDD).

Each decoder may include first to third stages that are connected sequentially.

A first boost circuit may be positioned between the second and third stages for providing interfacing between lower operating voltages of the first and second stages and higher operating voltages of the third stage.

The first boost circuit may include first to third transistors whose control terminals are commonly connected to the power supply voltage, and a capacitor having one end connected to a contact of the first and second transistors and the other end connected to an input terminal of the third transistor, wherein an input terminal of the first transistor can be connected to the power supply voltage and output terminals of the second and third transistors can be connected to each other.

The first and third transistors may be N-type transistors and the second transistor can be a P-type transistor.

The second boost circuit may generate a high voltage output (e.g., VDDH) based on first and second clock signals each having mutually opposite phases, and the second boost circuit may provide the generated high voltage (e.g., VDDH) to the third stage.

The second boost circuit may include first and second transistors whose control terminals are commonly connected to the second clock signal; a third transistor having a control terminal connected to an output terminal of the first transistor, an input terminal connected to the first clock signal, and an output terminal connected to the output terminal of the second transistor; and a capacitor connected between the control terminal and the output terminal of the third transistor.

The data signal may include a plurality of bits, the first to third stages may include at least a pair of switching units that are mutually connected, respectively, and one of the pair of switching units may receive one of the plurality of bits and the other may receive an inversion signal of the one bit.

The switching units may include two different transistors, respectively, and control terminals of the two transistors may be connected to each other, output terminals of the two transistors may be connected to each other, and input terminals of the two transistors may be connected to first and second voltages, respectively.

The first voltage may be a ground voltage or an output voltage of a previous stage, and the second voltage can be the power supply voltage.

The number of switching units belonging to the second stage or the third stage may be equal to the number of first boost circuits, and the number of switching units belonging to the first stage can be smaller than the number of switching units belonging to the second or third stage.

The first stage may include a pair of switching units, the second stage may include two pairs of switching units, and one of the two pairs of switching units of the second stage can be connected to one switching unit of the first stage and the other of the two pairs of switching units of the second stage can be connected to the remaining switching unit of the first stage.

A method for driving a display device in accordance with the disclosure may include converting external digital video data into corresponding analog voltages where the method comprises: inputting the video data; shifting and latching the video data; decoding the shifted and latched video data; and selecting an analog voltage corresponding to the decoded video data and outputting the selected voltage as an output analog voltage to the display device.

A display device in accordance with the disclosure may include a switching unit connected to a first power supply voltage (VDD), a first boost circuit connected to the switching unit, a second boost circuit for receiving a clock signal, and a selecting unit for selecting an output of the second boost circuit or ground for driving analog section switches (SW).

The decoding of the video data may include generating a first output through the switching unit, amplifying the first output by using the first boost circuit, amplifying the clock signal inputted through the second boost circuit, and selecting an output of the second boost circuit or ground for application to analog section switches (SW).

The display device may include a plurality of pixels and data lines connected thereto, and the method for driving the display device may further include applying an analog voltage selected by the analog section switches (SW) to the data lines of the display device.

BRIEF DESCRIPTION OF THE DRAWINGS

The accompanying drawings briefly described below illustrate exemplary embodiments and, together to the description, serve to explain various details of the disclosure.

DETAILED DESCRIPTION

Figure 1:
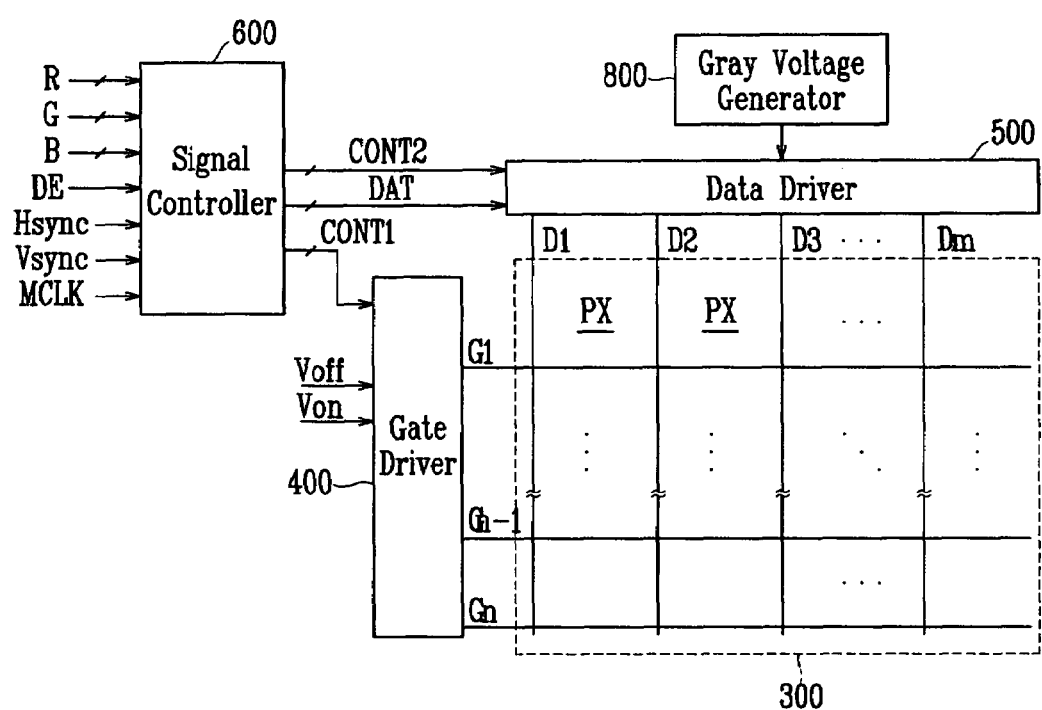
FIG. 1 is a schematic block diagram of a liquid crystal display (LCD) according to one exemplary embodiment.

In the drawings, the thickness of layers, films, panels, regions, etc., may be exaggerated for clarity rather than being to scale. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
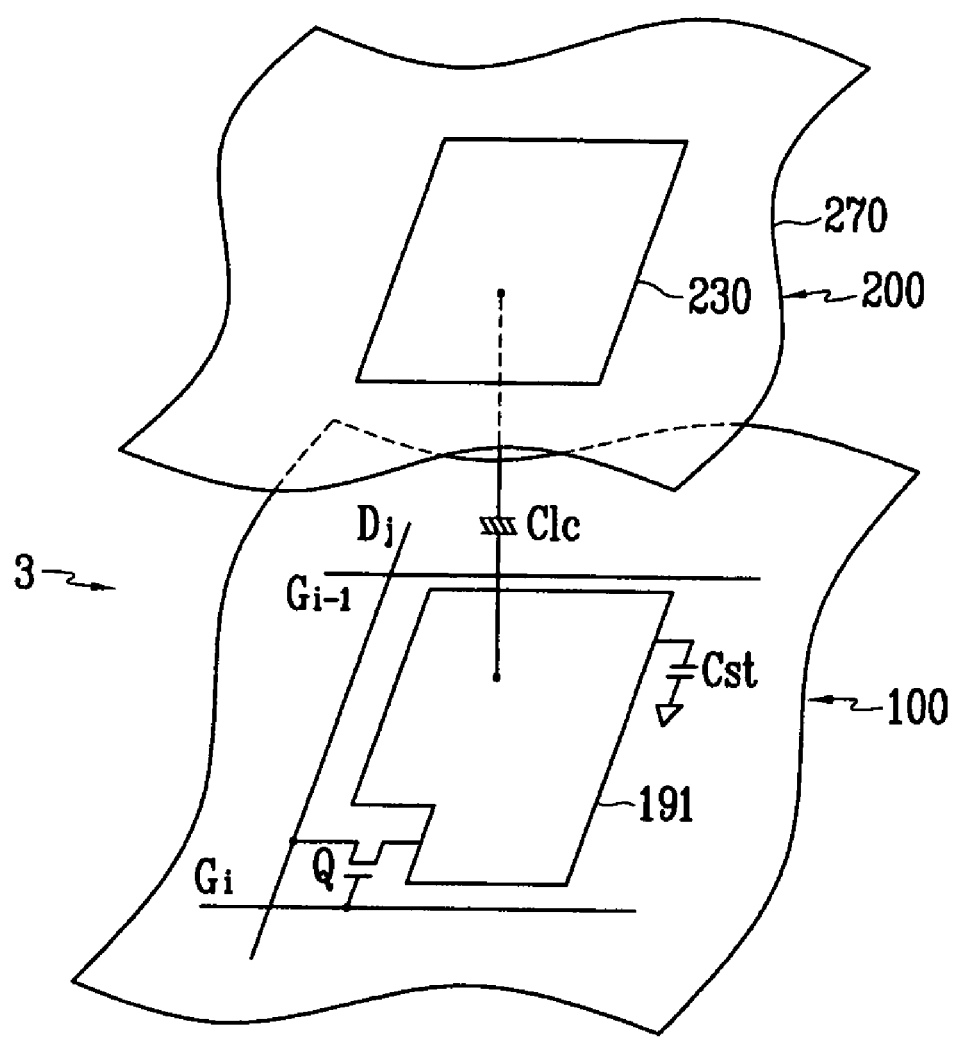
FIG. 2 is an equivalent circuit diagram for a single pixel of the LCD according to one exemplary embodiment.

Referring to first to FIGS. 1-2, a flat panel display device according to one exemplary embodiment, for example a liquid crystal display (LCD), will be described in detail.

FIG. 1 is a schematic block diagram of a liquid crystal display (LCD) according to one exemplary embodiment and FIG. 2 is an equivalent circuit diagram for a single pixel area of the LCD.

As shown in FIG. 1, an LCD structured in accordance with one exemplary embodiment includes a liquid crystal panel assembly (area 300), a gate-lines driver circuit 400 coupled to gate lines of the LCD, a data driver circuit 500 coupled to data lines of the LCD, a gray voltages generator 800 connected to the data driver 500, and a signal controller 600 coupled to the gate-lines driver circuit 400 and to data driver circuit 500 for controlling them.

In terms of an equivalent circuit, the liquid crystal panel assembly 300 includes a plurality of gate signal lines $G_1$-$G_n$ and a plurality of data signal lines $D_1$-$D_m$ and a plurality of pixel units PX each connected to a respective crossing pair among the plurality of signal lines $G_1$-$G_n$ and $D_1$-$D_m$ and where the pixel units PX are arranged substantially in a matrix form. In terms of the structure as shown in FIG. 2, the liquid crystal panel assembly 300 includes lower and upper panel layers 100 and 200 and a liquid crystal material layer 3 interposed therebetween.

The gate lines $G_1$-$G_n$ are used for transferring gate signals (also called scan signals) and the data lines $D_1$-$D_m$ are used for transferring data signals. The gate lines $G_1$-$G_n$ extend substantially in a row direction and are substantially parallel to each other, and the data lines $D_1$-$D_m$ extend substantially in a column direction and are substantially parallel to each other.

Each pixel unit PXij, i.e., a pixel PX connected to the ith (i=1, 2, . . . , n) gate line $G_i$ and the jth (j=1, 2, . . . , m) data line $D_j$, includes a corresponding switching element Qij connected to the signal lines $G_i$ and $D_j$, and a liquid crystal capacitor Clc and a storage capacitor Cst connected thereto. The storage capacitor Cst can be omitted if desired.

The switching element Qij can be a three-terminal element such as a thin film field effect transistor (TFT) provided on the lower panel layer 100, which includes a control terminal connected to the gate line $G_i$, an input terminal (first source/drain) connected to the data line $D_j$, and an output terminal (second source/drain) connected to a pixel-electrode portion 191 of the liquid crystal capacitor Clc and to the storage capacitor Cst.

The liquid crystal capacitor Clc has a pixel electrode 191 formed in the lower panel layer 100 and a common electrode 270 formed in the upper panel layer 200 with the liquid crystal material layer 3 between the two electrodes 191 and 270 serving as a dielectric material. The pixel electrode 191 is connected to the switching element Q, and the common electrode 270 is formed on the entire surface of the upper panel 200 and receives a common voltage Vcom. Unlike what is shown in FIG. 2, the common electrode 270 can alternatively be provided on the lower panel layer 100, and in this case, at least one of the two electrodes 191 and 270 can be formed in a linear or bar shape for interdigitation with the other.

The storage capacitor Cst serves as an auxiliary charge storage means to supplement the storage capacity of the liquid crystal capacitor Clc and the Cst may be formed as a separate signal line (not shown) provided on the lower panel layer 100 with the pixel electrode 191 overlapping it and having an insulator interposed therebetween, and a predetermined voltage such as the common voltage Vcom (i.e., ground) or the like is applied to the separate signal line. Also, the storage capacitor Cst can be formed as the pixel electrode 191 overlaps the immediately previous gate line by the medium of the insulator.

In order to implement a color display, each pixel unit PX specifically displays one of the primary colors (spatial division) and/or pixel units PX are activated to alternately display different ones of the primary colors over time (temporal division), so that a desired color can be recognized by the spatial and/or temporal sum of the primary colors. The primary colors can be, for example, the three primary colors of red, green, and blue. FIG. 2 shows one example of spatial division in which each pixel unit PX includes a color filter 230 that optically passes one of the primary colors at a region of the upper panel 200 corresponding to the pixel electrode 191. Different from the color filter 230 as shown in FIG. 2, the color filter 230 can be formed above or below the pixel electrode 191 of the lower panel 100.

At least one polarizer (not shown) may be provided for polarizing light and may be attached on an outer surface of the liquid crystal panel assembly 300.

Referring back to FIG. 1, in one embodiment, the gray voltages generator 800 generates two sets of gray voltages (or a set of reference gray voltages) related to light transmittance needs of the pixel units PX. In one embodiment, one of the two sets of the gray voltages has positive values and the other has negative values relative to a given reference or common voltage.

The gate-driver 400 is connected to the gate lines $G_1$-$G_n$ of the liquid crystal panel assembly 300 and applies digitally-switched gate signals including a combination of a gate-on voltages Von and gate-off voltages Voff to the gate lines $G_1$-$G_n$.

The data driver 500 is connected to the data lines $D_1$-$D_m$ of the liquid crystal panel assembly 300, selects an analog gray voltage from the gray voltages generator 800, and applies it as a data signal to the data lines $D_1$-$D_m$. In this respect, if the gray voltages generator 800 does not provide all the gray voltages needed for driving the pixel units PX but instead provides only a predetermined number of reference gray voltages, the data driver 500 uses the reference gray voltages to generate additional gray voltages for all gray scales and selects a data signal from the generated spectrum of gray voltages.

The signal controller 600 controls the gate-driver 400 and the data driver 500.

The drivers 400, 500, 600, and 800 can be directly mounted in the form of at least one IC chip on the liquid crystal panel assembly 300, or it can be mounted on a flexible printed circuit film (not shown) and attached in the form of a TCP (tape carrier package) on the liquid crystal panel assembly 300, or it can be mounted on a separate printed circuit board (not shown). Alternatively, the drivers 400, 500, 600, and 800 can be respectively integrated together with the signal lines $G_1$-$G_n$ and $D_1$-$D_m$, the thin film transistors (TFTs), and the switching elements Q, on the liquid crystal panel assembly 300. As a further alternative, the drivers 400, 500, 600, and 800 can be integrated as a single chip, and in this case, at least one of them or at least one member among them can be positioned outside the single chip.

The operation of the LCD will now be described in further detail.

The signal controller 600 receives input video signals R, G, and B and input control signals for controlling display of the input video signals from an external graphics controller (not shown). The input control signals include, for example, a vertical synchronization signal Vsync, a horizontal synchronization signal Hsync, a main clock signal MCLK, a data enable signal DE, etc.

The signal controller 600 appropriately processes the input video signals R, G, and B according to operating conditions of the liquid crystal panel assembly 300 based on the input video signals R, G, and B and the input control signals, and responsively generates a gate control signal CONT1 and a data control signal CONT2, etc., and transmits the gate control signal CONT1 to the gate-driver 400 and transmits the data control signal CONT2 and the processed video signal DAT to the data driver 500.

The gate control signal CONT1 includes a scanning start signal STV for indicating start of scanning, and at least one clock signal for controlling an output period of the gate-on voltage Von. The gate control signal CONT1 may additionally include an output enable signal OE for limiting duration of the gate-on voltage Von.

The data control signal CONT2 includes a horizontal synchronization start signal STH for informing of starting of transmission of the video data with respect to one row of pixels PX, a load signal TP for indicating applying of a data signal to the data lines $D_1$-$D_m$, and a data clock signal HCLK. The data control signal CONT2 may additionally include an inversion signal RVS for inverting the polarity of the voltage of a data signal with respect to the common voltage Vcom (which attribute of the data signal is called "polarity of data signal" hereinafter).

The data driver 500 receives the digital video signal DAT with respect to one row of pixels PX according to the data control signal CONT2 received from the signal controller 600, selects a gray voltage corresponding to each digital video signal DAT to convert the digital video signal DAT into a corresponding analog data signal, and applies the corresponding analog data signal to a corresponding one of data lines $D_1$-$D_m$.

The gate-driver 400 applies the gate-on voltage Von to the gate lines $G_1$-$G_n$ according to the gate control signal CONT1 from the signal controller 600 to turn on the switching elements Q connected to the gate lines $G_1$-$G_n$. Then, the data signal, which has been applied to the data lines $D_1$-$D_m$, is applied to the pixel-electrode of the corresponding pixel units PX through the turned-on switching elements Q.

A difference between voltage of the data signal applied to the pixel electrodes and the common voltage Vcom appears as a charge voltage, namely, a pixel voltage, of the liquid crystal capacitor Clc of each pixel unit PX. Arrangement of liquid crystal molecules is changed according to the size of the pixel voltage, and polarization of light that transmits through the liquid crystal material layer 3 is changed accordingly. The change in the polarization appears as a change in intensity or transmittance of light by the polarizer attached on the liquid crystal panel assembly 300.

This process is repeatedly performed over a temporal unit of one horizontal period (namely, "1H" which is equivalent to one period of the horizontal synchronization signal Hsync and the data enable signal DE), whereby when the gate-on voltage Von is sequentially applied over a vertical scan period to all the gate lines $G_1$-$G_n$ to thereby apply the data signals to all the pixel units PX and to thus display an image of one frame.

When one frame is finished, the next frame is started and in one embodiment, a state of the inversion signal RVS applied to the data driver 500 is controlled ("frame inversion") such that the polarity of data signals applied to each pixel unit PX can be opposite to the polarity in the previous frame so as to thereby twist the liquid crystal molecules in an opposed direction. In this case, even in one frame, the polarity of a data signal flowing through one data line can be changed according to characteristics of the inversion signal RVS (e.g., row inversion or dot inversion), or polarity of a data signal applied to one pixel row can be different (e.g., column inversion or dot inversion).

Drivers of the LCD according to one exemplary embodiment will now be described in detail with reference to FIGS. 3A to 7.

Figure 3A:
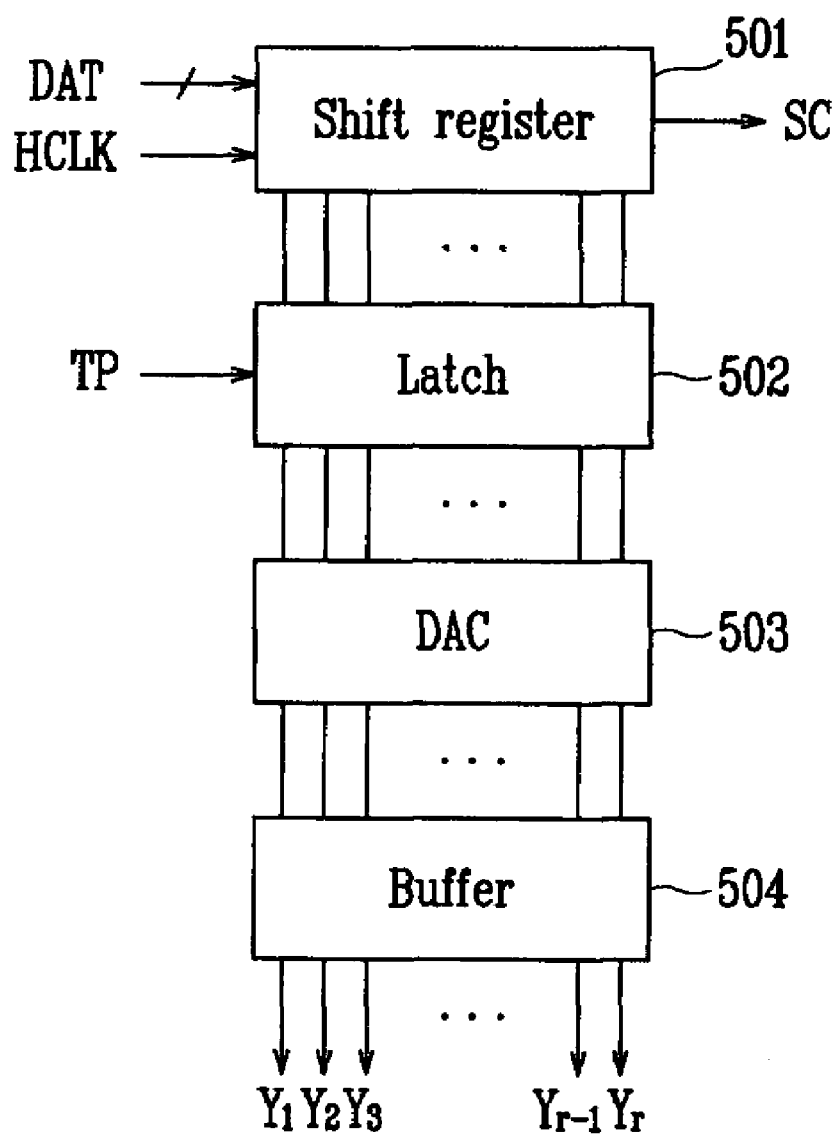
FIG. 3A is a schematic block diagram of a data driver of FIG. 1.
Figure 3B:
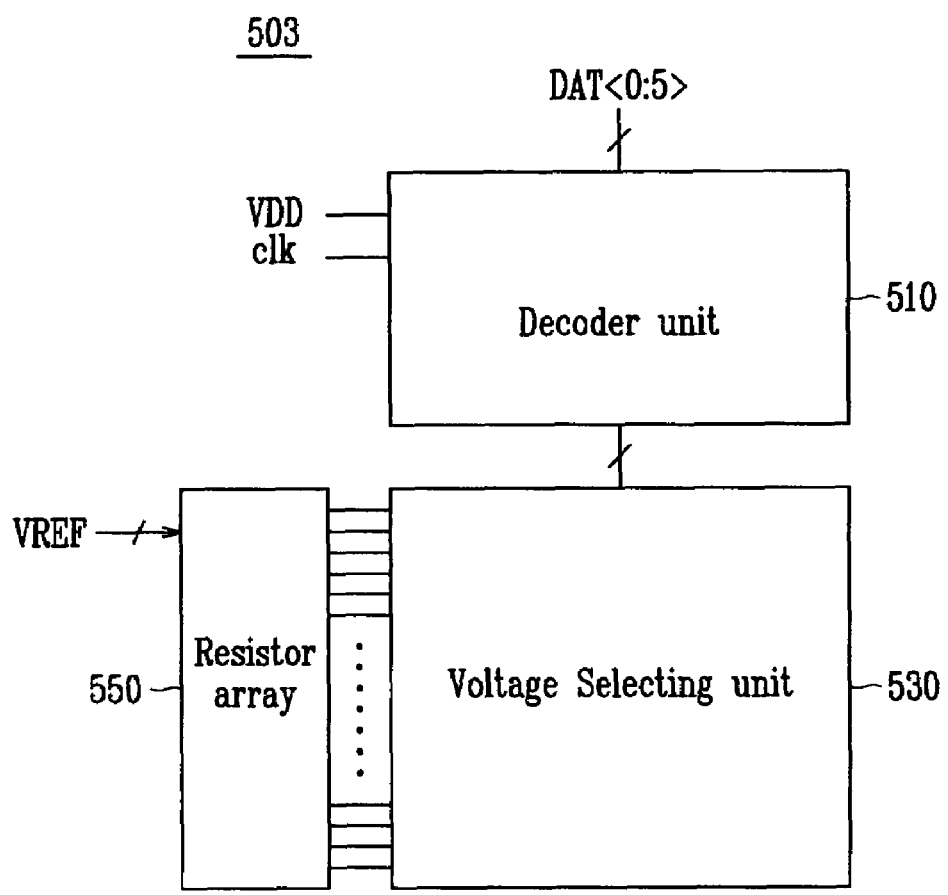
FIG. 3B is a schematic block diagram of a digital-to-analog converter of FIG. 3A.
Figure 4:
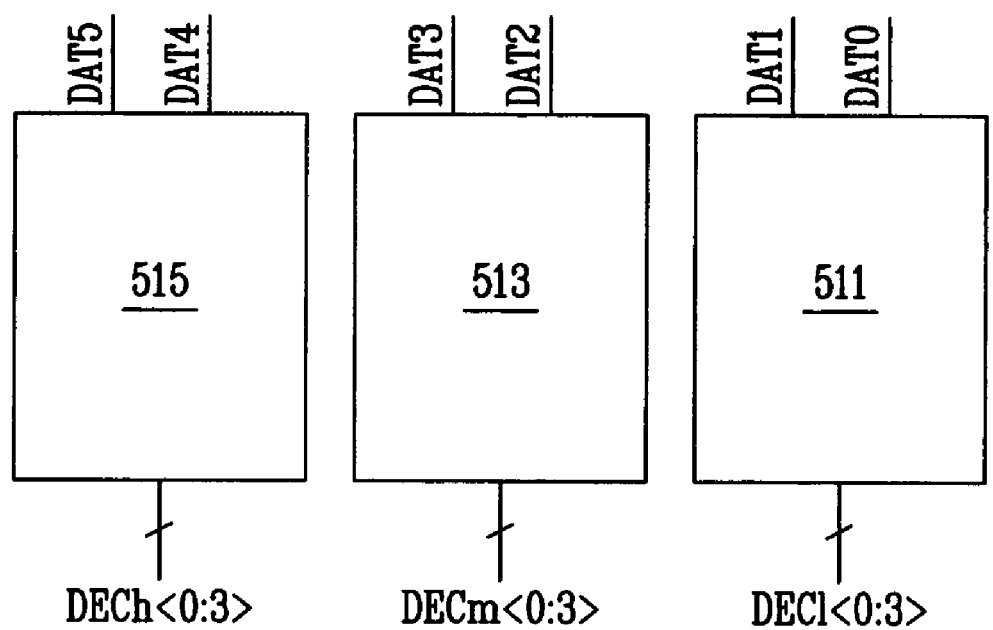
FIG. 4 is a schematic block diagram of a decoder unit of FIG. 3B.
Figure 5:
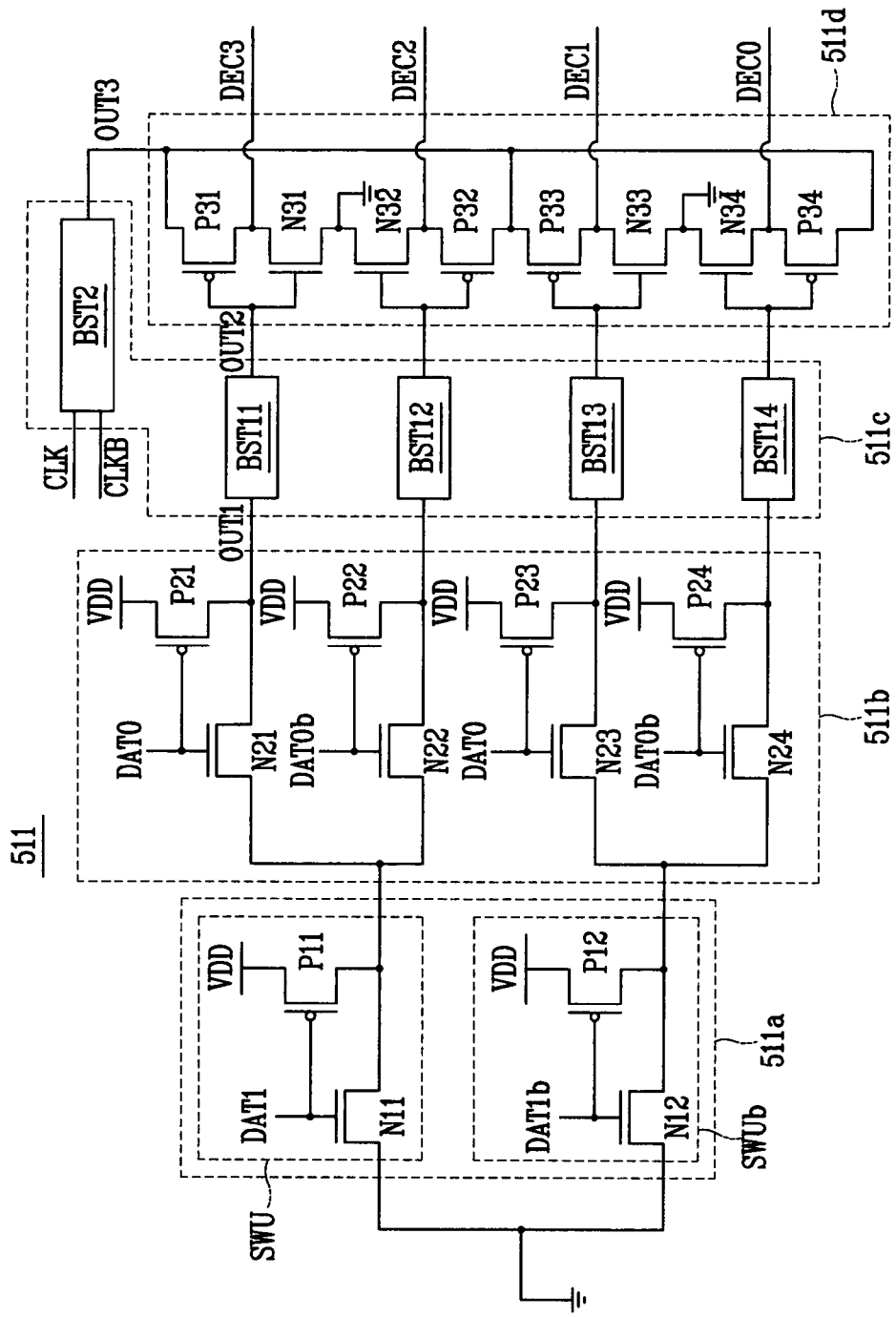
FIG. 5 is a circuit diagram of one decoder of FIG. 4.
Figure 6A:
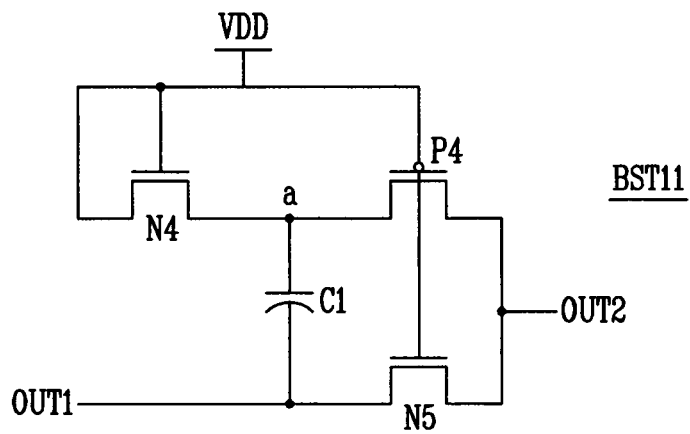
FIGS. 6A and 6B are circuit diagrams of a boost circuit of FIG. 5.
Figure 6B:
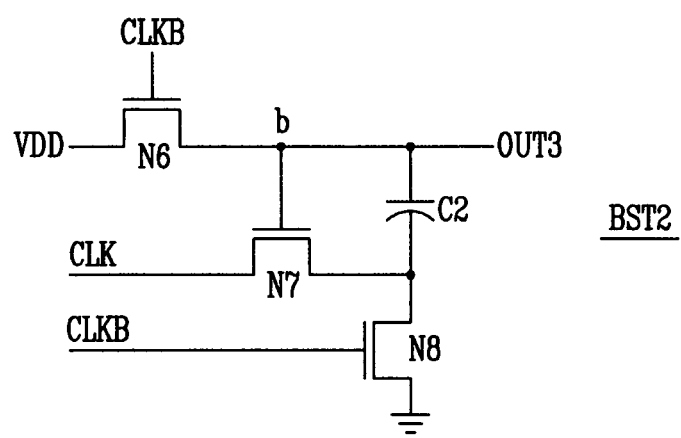
Figure 7:
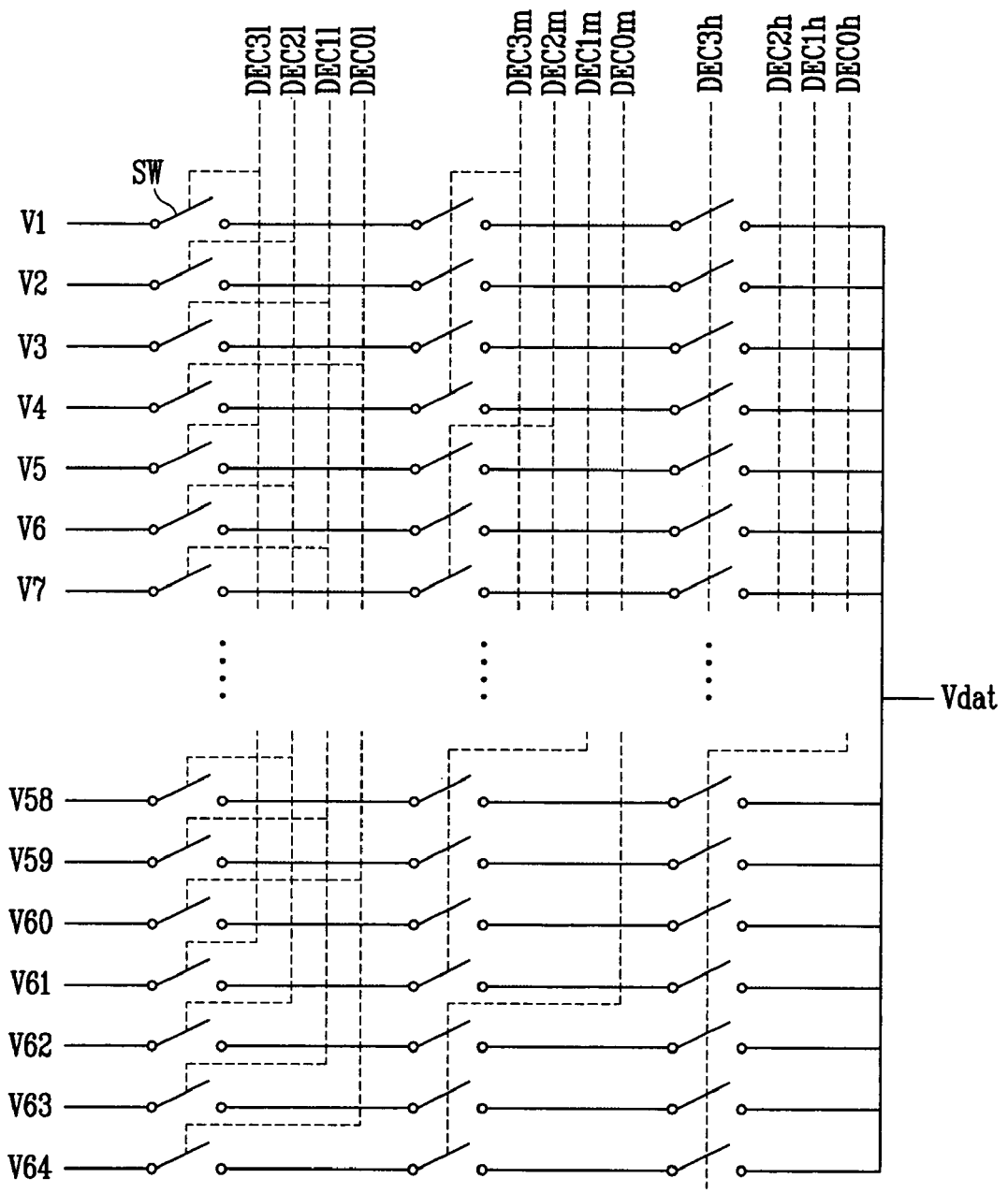
FIG. 7 is a circuit diagram of a voltage selecting unit of FIG. 3B.

FIG. 3A is a schematic block diagram of a data driver of FIG. 1, FIG. 3B is a schematic block diagram of a digital-to-analog converter (DAC) of FIG. 3A, and FIG. 4 is a schematic block diagram of a decoder unit of FIG. 3B. FIG. 5 is a circuit diagram of one decoder of FIG. 4, FIGS. 6A and 6B are circuit diagrams of boost circuits of FIG. 5, and FIG. 7 is a circuit diagram of a voltage selecting unit of FIG. 3B.

Hereinbelow, it is assumed that inputted video data DAT has, for example, 6 bits per pixel so as to thereby specify 64 different gray levels per pixel.

The data driver 500 includes at least one data driving IC 540 as shown in FIG. 3A, and the data driving IC 540 includes a shift register 501, a latch 502, a digital-analog converter (DAC) 503, and an analog output buffer 504.

When the shift register 501 of the data driving IC 540 receives the horizontal synchronization start signal STH, it sequentially shifts inputted video data DAT according to the data clock signal HCLK and transfers them to the latch 502. In the case where the data driver 500 includes a plurality of data driving ICs 540, the shift register 501 may shift the entire video data DAT handled by the shift register 501 itself and it may output a shift clock signal SC to a shift register of a neighboring data driving IC.

The latch 502 includes first and second latches (not shown). The first latch sequentially (serially) receives the video data DAT from the shift register 501 and stores them, and the second latch simultaneously receives (in parallel) the video data DAT from the first latch at a rising edge of a load signal TP, stores them, and outputs them to the DAC 503 at a falling edge of the load signal TP.

The DAC 503 converts the digital video data DAT from the latch 502 into corresponding analog data voltages Vdat, and outputs them to the buffer 504.

The buffer 504 outputs buffered versions the data voltages from the DAC 503 through output terminals $Y_1$-$Y_r$. The output terminals $Y_1$-$Y_r$ are connected to corresponding data lines $D_1$-$D_m$.

As shown in FIG. 3B, the DAC 503 includes a decoder unit 510, a voltage selecting unit 530, and a resistor array 550.

The decoder unit 510 is connected to a power supply voltage VDD and a clock signal CLK, and as mentioned above, it receives the digital data signal DAT.

As shown in FIG. 4, the decoder unit 510 includes a plurality of 2-to-one-of-4 bit decoders 511, 513, and 515.

The decoders 511, 513, and 515 receive a lower two bits (DAT0 and DAT1), a middle two bits (DAT2 and DAT3), and an upper two bits (DAT4 and DAT5), respectively, and output a lower 4 bits DECl, a middle 4 bits DECm, and an upper 4 bits DECh, respectively. This operation will now be described in more detail with reference to FIG. 5.

FIG. 5 shows the structure of the decoder 511 as an example, and the other decoders 513 and 515 have the same structure, so their descriptions will be omitted.

Here, the data signals DAT or the clock signals CLK with a suffix mark "b" or "B" refer to inversion signals. For example, when DAT1 has a high or low level, DAT1b has a corresponding low or high binary level.

With reference to FIG. 5, the decoder 511 includes first to fourth stages 511a, 511b, 511c, and 511d including a plurality of N-type transistors N11, N12, N21, N22, N23, N24, N31, N32, N33, and N34, a plurality of P-type transistors P11, P12, P21, P22, P23, P24, P31, P32, P33, and P34, and boost circuits BST11-BST14 and BST2.

The first stage 511a, the second stage 511b, and the fourth stage 511d include a pair of CMOS switching units SWU and SWUb in which control terminals and output terminals (drains) of the N-type transistors and the P-type transistors are correspondingly connected. The first stage 511a includes a pair of switching units, and the second and fourth stages 511b and 511d include two pairs of switching units, respectively.

For example, in the switching unit SWU of the first stage 511a, control terminals of the N-type transistor N11 and the P-type transistor P11 are connected, and output terminals of the two transistors N11 and P11 are also connected. In the two switching units SWU and SWUb, the sources of N-type transistors N11 and N12 are connected to ground and the sources of P-type transistors P11 and P12 are connected to VDD. A first data signal DAT1 is inputted to the switching unit SWU, its inverted signal DAT1b is inputted to the switching unit SWUb, and a ground voltage or a power supply voltage VDD is transferred to the next stage according to steering by the data signal DAT1 and the inverted signal DAT1b.

The third stage 511c includes a plurality of boost circuits BST11, BST12, BST13, BST14, and BST2, and it receives a 4-bit signal OUT1 from the second stage 511b, amplifies or shifts the high levels above that of the power supply voltage VDD and outputs the voltage-boosted 4-bit signal OUT2 to the fourth stage 511d.

As shown in FIGS. 6A and 6B, for example, the boost circuit BST11 includes a plurality of transistors N4, N5, and P4, and a capacitor C1, and the boost circuit BST2 includes the plurality of transistors N6 to N8 and a capacitor C2. The other boost circuits BST12, BST13, and BST14 have the same structure as BST11.

As shown in FIG. 6A, the control terminals (gates) of the three transistors N4, N5, and P4 of the first boost circuit BST11 are commonly connected to the power supply voltage VDD, and an input terminal (first source/drain) of the transistor N4 is also connected to the power supply voltage VDD. An output terminal (second source/drain) of the transistor N4 is connected to an input terminal (first source/drain) of the transistor P4, and is also connected via capacitor C1 to an input terminal (first source/drain) of N5. Output terminals of the two transistors P4 and N5 are connected, and the output OUT1 from the second stage 511b is inputted to the input terminal of the transistor N5.

The second boost circuit BST2 operates as a periodic voltage doubler and periodically has an above-Vdd high level on its OUT2 terminal when CLK is high even though the second boost circuit BST2 is powered by the power supply voltage VDD, and connected to have a low level, the same as the ground voltage. The second boost circuit BST2 receives first and second clock signals CLK and CLKB each having mutually opposite phases.

The boost circuit BST2 includes the transistors N6 to N8, which are all N-type transistors. An input terminal of the transistor N6 is connected to the power supply voltage VDD, a control terminal thereof is connected to the second clock signal CLKB, and an output terminal thereof is connected to a control terminal of the transistor N7. An input terminal of the transistor N7 is connected to the first clock signal CLK, and an output terminal thereof is connected to an output terminal of the transistor N8. A control terminal of the transistor N8 is connected to the second clock signal CLKB, and an input terminal thereof is connected to a ground voltage. The capacitor C2 is connected between the control terminal and the output terminal of the transistor N7.

The operation of the decoder unit 511 having the structure as described above will now be described and in the case in which is assumed that the data signals DAT1 and DAT0 have a low level, respectively (00). Accordingly, the inversion signals DAT1b and DAT0b of the data signals DAT1 and DAT0 have a high level, respectively.

First, when the data signal DAT1 having the low level is inputted to the switching unit SWU of the first stage 511a, the N-type transistor N11 is turned off and the P-type transistor P11 is turned on to output the power supply voltage VDD to the next stage 511b. Meanwhile, when the inversion signal DAT1b having the high level is inputted to the switching unit SWUb of the first stage 511a, the N-type transistor N12 is turned on and the P-type transistor P12 is turned off to transfer a ground voltage to the next stage 511b.

Likewise, in the second stage 511b, the data signal DAT0 has the low level and its inversion signal DAT0b has the high level, a first switching unit SWU in the second stage 511b outputs the power supply voltage VDD to the boost circuit BST11 of the next stage 511c and a second switching unit SWUb also outputs the power supply voltage VDD, an input of the transistor N22, to the boost circuit BST12. A third switching unit SWU in the second stage 511c outputs the power supply voltage VDD to the boost circuit BST13 and a fourth switching unit SWUb outputs a ground voltage to the boost circuit BST14.

The first boost circuit BST11 as shown in FIG. 6A receives the power supply voltage VDD, namely, the output OUT1 from the second stage 511b.

Regarding the first boost circuit BST11, the input terminal and the control terminal of the transistor N4 are commonly connected to the power supply voltage VDD, so that N4 is serving as a diode-connected transistor and is in the constantly turned-on state when OUT1 is low so a to charge capacitor C1 when OUT1 is low. (N4 could be replaced with a diode or a diode resistor series circuit for charging capacitor C1 when OUT1 is low.) As a result, the voltage developed at the node (a) when OUT1 is low has a value obtained by subtracting a threshold voltage of the transistor N4 from the power supply voltage VDD. (Va=Vdd−Vt when OUT1 is low.) In the case of the transistor P4, when OUT1 is low, the voltage of the input terminal of P4 i.e., of node (a) is smaller than the power supply voltage VDD connected to the control terminal thereof, and thus the transistor P4 is in an OFF state when OUT1 is low.

In the case of the transistor N5, a state of the transistor N5 is determined depending on the input voltage OUT1. Namely, when the power supply voltage VDD is inputted to the transistor N5, voltage of its control terminal and voltage of its input terminal become equal so the transistor N5 is turned off, while if the ground voltage is inputted (when OUT1 is low) to the transistor N5, voltage of its control terminal becomes relatively high so the transistor N5 is turned on thereby coupling the low voltage of OUT1 to the OUT2 terminal when OUT1 is low.

By contrast, when OUT1 is high (approximately equal to the power supply voltage VDD), the voltage at the node (a) increases to be as high as the sum of the power supply voltage VDD and the voltage stored by the capacitor C1. Accordingly, the voltage at the input terminal of P4 is higher than the voltage of its control terminal, so the transistor P4 is turned on to couple the above-Vdd voltage on node (a) to the OUT2 terminal at the time that OUT1 is high. As stated above, transistor N5 is turned off at this time. As a result, a voltage OUT2, substantially double the power supply voltage VDD, is outputted at the time that OUT1 is high. To sum up, when the ground voltage is inputted at the OUT1 terminal, the ground voltage is outputted at the OUT2 terminal. When the power supply voltage VDD is inputted at the OUT1 terminal, a voltage corresponding to substantially double the power supply voltage VDD is outputted at the OUT2 terminal.

Figure 6C:
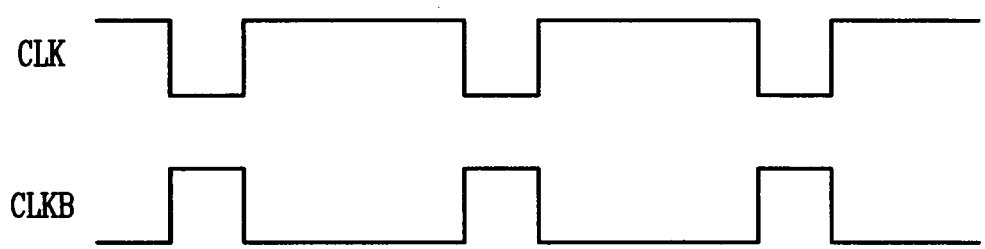
FIG. 6C is waveforms of clock signals shown in FIG. 6B.

As shown in FIG. 6C, the second boost circuit BST2 receives the first clock signal CLK having the same magnitude as the power supply voltage VDD. In one embodiment, the first clock signal CLK has a duty ratio of about 75% or greater, and the second clock signal CLKB having the same magnitude as the power supply voltage VDD and a duty ratio of about 25% or smaller.

When the first clock signal CLK has a low level and the second clock signal CLKB has a high level, the transistors N6 and N8 are turned on to transfer the input voltage VDD to the node (b), namely, to one end of the capacitor C2, and the ground voltage to the other end of the capacitor C2, so the power supply voltage VDD is applied across the capacitor C2 and node (b) of capacitor C2 charges to the VDD level.

Subsequently, when the first clock signal CLK is changed to a high level and the second clock signal CLKB is changed to a low level, the two transistors N6 and N8 are turned off. Accordingly, the upper end of the capacitor C2 (node (b)) is cut off from the input voltage VDD (because N6 is nonconductive, having been turned off), and can thus float to a higher voltage state, and the lower end of the capacitor C2 receives the voltage (VDD) of the high first clock signal CLK, so the voltage at one end of the capacitor C2, namely, the voltage at the node (b), increases up to a value obtained by adding the voltage level of the high first clock signal CLK to the previous power supply voltage VDD. That is, as in the boost circuit BST11, the voltage corresponding to about double the power supply voltage VDD is outputted at the OUT3 terminal.

At this time, according to the outputs OUT2 from the boost circuits BST11, BST12, BST13, and BST14, one of the N-type transistors N31, N32, N33, and N34 and one of the P-type transistors P31, P32, P33, and P34 belonging to the switching units SWU and SWUb are selected, based on which one of the ground voltage and an output OUT3 from the boost circuit BST2 is selected so as to be finally generated as outputs DEC0, DEC1, DEC2, and DEC3 of the decoder 511.

For example, when the output OUT2 of the boost circuit BST11 has a high voltage level, the transistor N31 is turned on and the ground voltage is generated as the output DEC3 of the decoder 511, and when the output OUT2 of the boost circuit BST11 has a low voltage level, the transistor P31 is turned on and a high voltage is generated as the output DEC3 of the decoder 511. To sum up, the decoder 511 simultaneously operates to change the coding format from the multi-bit format of the DTA signal to a one-of-N format (i.e., 1-of-4) and to increase the operating voltage range of each of the 1-of-N bits.

Outputs of the decoders 511, 513, and 515 generated in this manner are inputted to the voltage selecting unit 530.

With reference to FIG. 7, a plurality of predefined gray voltages, namely, 64 gray voltages V1~V64, whose values may be established by using the resistor array 550 are shown at the left portion, and three switching elements SW are disposed for each row of the gray voltages V1~V64. That is, the switching elements SW are disposed in a matrix form of 64 rows and 3 columns overall. In one embodiment, switching elements SW may include MOS pass transistors. In another embodiment, switching elements SW may include CMOS transmission gates for passing analog voltages of one or more polarities therethrough.

The more significant or upper decoder outputs DEC0$h$, DEC1$h$, DEC2$h$, and DEC3$h$ are divided into four groups and 16 switching elements corresponding to one of the four groups are selected. Then for the middle significance decoder outputs DEC0$m$, DEC1$m$, DEC2$m$, and DEC3$m$ the 16 selected switching elements SW are divided into four groups and four switching elements SW corresponding to one of the group groups are selected. And finally for lower or least significant decoder outputs DEC01, DEC11, DEC21, and DEC31, one of the four selected switching elements SW is selected. (Note that 4×4×4=64.)

Figure 8:
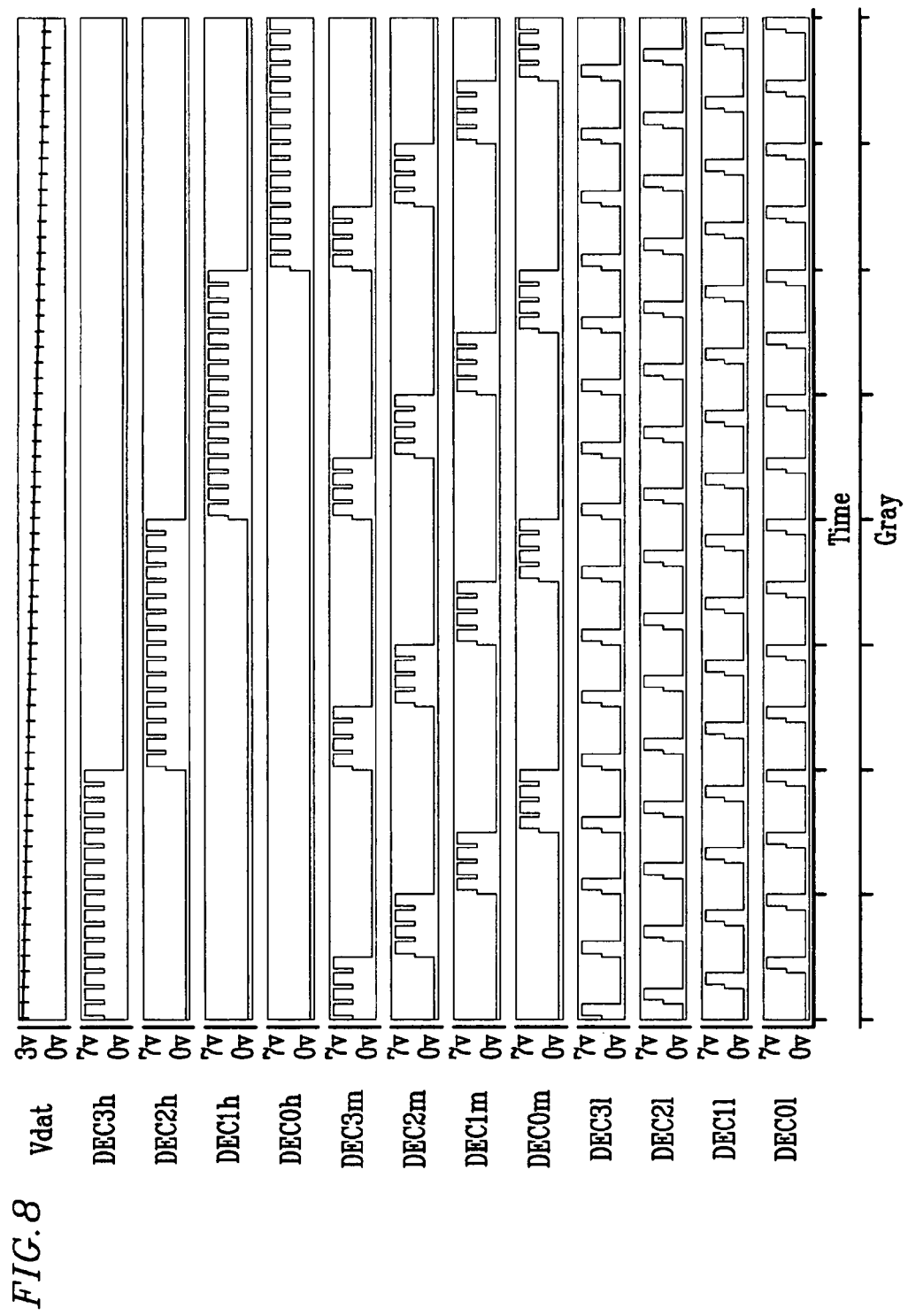
FIG. 8 is a simulation waveform view of outputs and data voltages of the decoder unit.

A single gray voltage may be selected in this manner to define the analog data voltage Vdat, which is applied to the data lines $D_1$-$D_m$. FIG. 8 shows waveforms that may be obtained by simulating the process of selecting the decoder outputs DEC0$h$, DEC1$h$, DEC2$h$, DEC3$h$, DEC0$m$, DEC1$m$, DEC2$m$, DEC3$m$, DEC01, DEC11, DEC21, and DEC31, and the data voltage Vdat under the conditions that the levels of the power supply voltage VDD and the clock signals is around 5V.

When a threshold voltage of the two transistors N6 and N8 are 0.7V, respectively, voltage generated from the boost circuit BST2 is theoretically 8.6V which is obtained by subtracting 1.4V, namely, the threshold voltage of the two transistors N6 and N8, from 10V, which is obtained by adding the power supply voltage VDD and the voltage of the high state clock signal CLK. However, when the simulation was performed in consideration of parasitic capacitance existing among the transistors N6 to N8, the 8.6V theoretical value was not obtained and instead an output value of about 7V of decoder outputs DEC0$h$, DEC1$h$, DEC2$h$, DEC3$h$, DEC0$m$, DEC1$m$, DEC2$m$, DEC3$m$, DEC01, DEC11, DEC21, and DEC31 was obtained. That is, the result was obtained by taking into consideration that the voltages of both ends of the capacitor C2 were not 4.3V but were about 3.3V, which is lower by 1V than the 4.3V due to the parasitic capacitance, when the second clock signal CLKB has the high level.

However, that level of voltage, i.e., 3.3V, is sufficient to turn on the switching elements SW of FIG. 7 which are shown connected in series in the voltage selecting unit 530 to output the gray voltages V1~V64 as the data voltage Vdat.

Figure 9A:
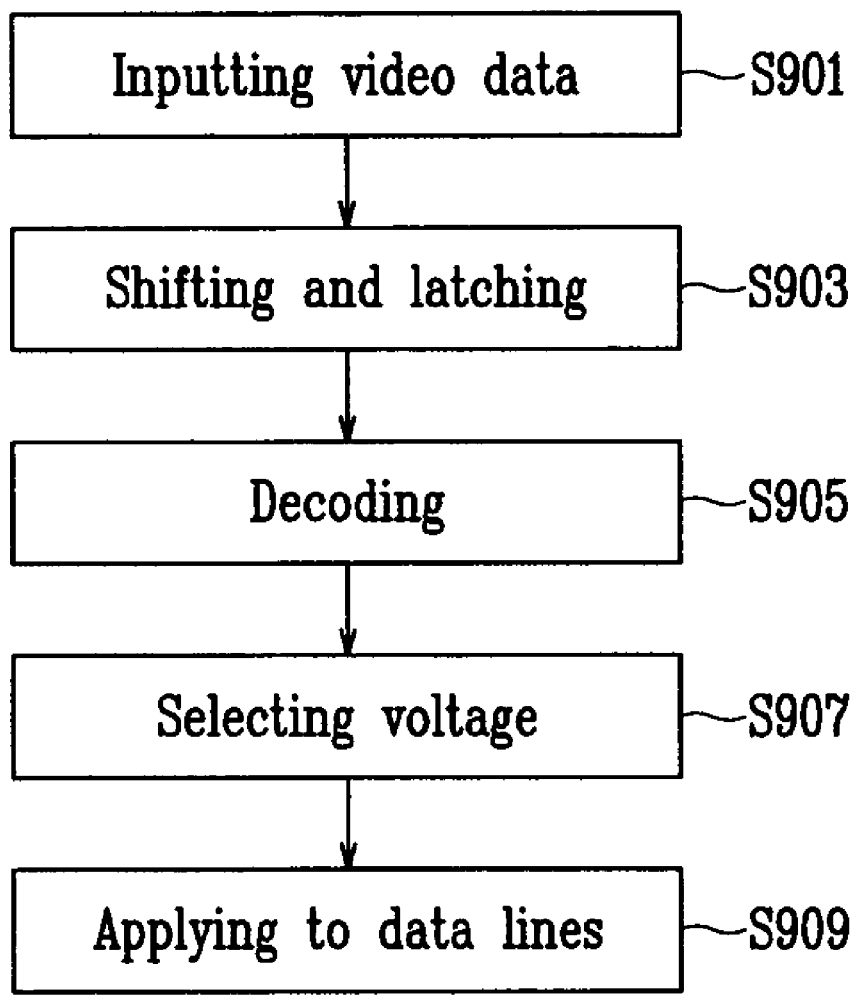
FIGS. 9A and 9B are flow charts illustrating the processes of a method for driving a display device according to one exemplary embodiment.
Figure 9B:
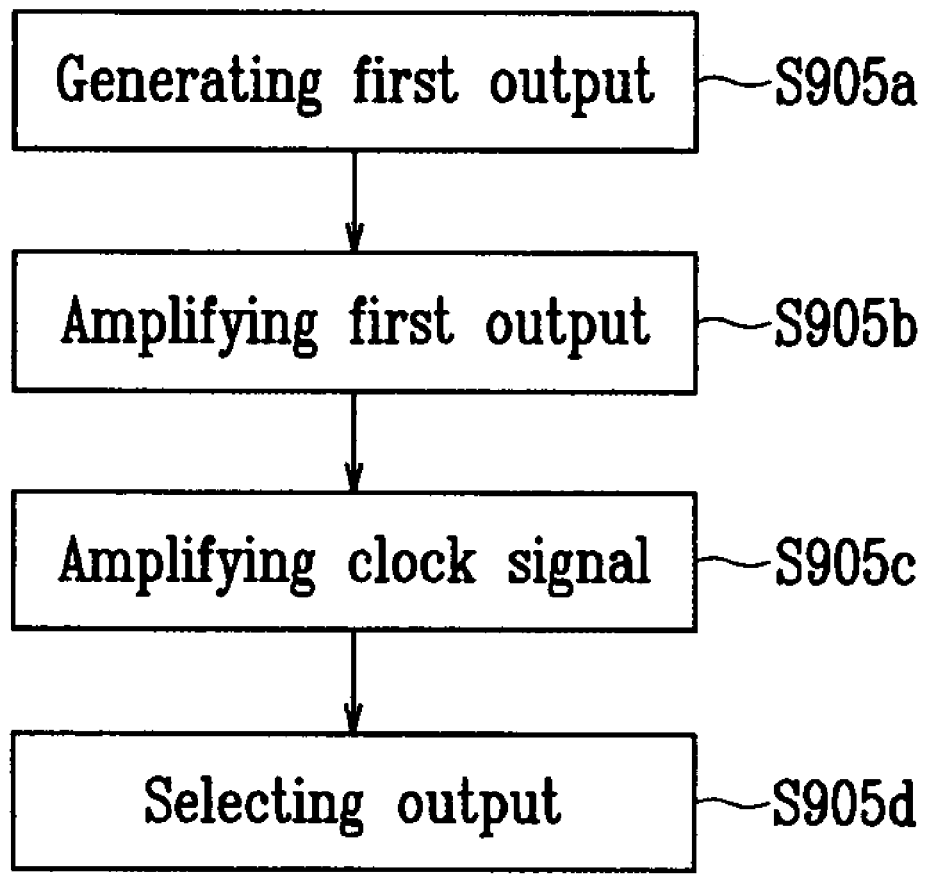

The operation of the data driver 500 including the digital converter will now be described with reference to FIGS. 9A and 9B.

First, when video data DAT operating in the binary range of about 0v-5V is inputted from the signal controller 600 to the data driver 500 (S901), it passes through the shift register 501 and the latch 502 (S903), and is then inputted to the DAC 503. The inputted data DAT is decoded in the decoder unit 510 (S905), selected as an analog voltage in the voltage selecting unit 530 (S907), and is then applied as the data voltage Vdat to the data lines $D_1$-$D_m$ (S909).

In detail, in the decoding step S905, the first output is generated through the switching unit SWU connected with the power supply voltage (S905$a$), and then the switching voltage is amplified by using the first boost circuits BST11, BST12, BST13, and BST14 (S905$b$). Also, the clock signals CLK and CLKB inputted through the second boost circuit BST2 and are amplified (S905$c$), and then the output of the first boost circuits BST11, BST12, BST13, and BST14 or the output of the second boost circuit BST2 is selected (S905$d$).

Accordingly, the data driver 500 of the display device according to the exemplary embodiment can obtain the desired analog data voltage Vdat of high magnitude by using the boost circuits BST11, BST12, BST13, BST14, and BST2 that use only the one power supply voltage VDD and yet produce digital selection signals of higher magnitude. Therefore, compared with the case where a DC/DC converter is used to form a second power supply, not only can an area for mounting the driving circuits be reduced, but power consumption can be considerably reduced since there is no need for a separate DC/DC converter.

It is to be understood that the present disclosure of invention is not limited to the disclosed embodiments, but, on the contrary, is intended to cover various modifications and equivalent arrangements included within the spirit and scope of the disclosure.

What is claimed is:

1. A digital-to-analog converter (DAC) comprising:
   a first set of terminals for receiving first digital signals operating in a first predefined voltage range;
   an output terminal for outputting analog signals operating across a second predefined voltage range, the second predefined voltage range being substantially wider than the first predefined voltage range;
   one or more decoder stages operating in the first predefined voltage range and configured to decode the first digital signals and produce therefrom second digital signals operating in the first predefined voltage range;
   a plurality of first voltage boost circuits coupled to the one or more decoder stages so as to convert the second digital signals into corresponding third digital signals operating in a third predefined voltage range, the third predefined voltage range being substantially wider than the first predefined voltage range, wherein the first voltage boost circuits do not receive a power input voltage of a magnitude greater than a highest voltage in said first predefined voltage range; and
   a plurality of switching elements operatively coupled to the output terminal and configured to switch states in response to the third digital signals produced by the first voltage boost circuits.

2. A digital-to-analog converter (DAC) comprising:
   a first set of terminals for receiving first digital signals operating in a first predefined voltage range;
   an output terminal for outputting analog signals operating across a second predefined voltage range, the second predefined voltage range being substantially wider than the first predefined voltage range;
   one or more decoder stages operating in the first predefined voltage range and configured to decode the first digital signals and produce therefrom second digital signals operating in the first predefined voltage range;

a plurality of first voltage boost circuits coupled to the one or more decoder stages so as to convert the second digital signals into corresponding third digital signals operating in a third predefined voltage range, the third predefined voltage range being substantially wider than the first predefined voltage range; and a plurality of switching elements operatively coupled to the output terminal and configured to switch states in response to the third digital signals produced by the first voltage boost circuits; and further wherein:

each of the first voltage boost circuits includes a first capacitor (C1) that is charged to a voltage defining a boost amount and is operatively coupled to be in series with an input signal of the first voltage boost circuit when the input signal is at a binary high level so as to thereby produce a boosted output signal whose magnitude is a function of the sum of the boost amount and the binary high level of the input signal.

3. The DAC of claim 2 wherein each of the first voltage boost circuits further includes:

a P type transistor having a gate coupled to a VDD power line and a first source/drain coupled to one plate of said first capacitor (C1);

a first N type transistor having a gate and a first source/drain commonly coupled to the VDD power line and a second source/drain coupled to the one plate of said first capacitor (C1); and a second N type transistor having a gate coupled to the VDD power line and a first source/drain coupled to an opposed plate of said first capacitor (C1);

where second source/drains of the P and the second N transistors couple to an output terminal of the first voltage boost circuit.

4. The DAC of claim 1 and further comprising:

a second voltage boost circuit coupled to clock lines of DAC so as to convert clock signals developed thereat into a corresponding high voltage of said third predefined voltage range.

5. The DAC of claim 4, wherein the second voltage boost circuit comprises:

first and second transistors whose control terminals are commonly connected to a first line of the clock lines, wherein the first line transmits a first clock signal;

a third transistor having a control terminal connected to an output terminal of the first transistor, an input terminal connected to a second line of the clock lines, and an output terminal connected to the output terminal of the second transistor, wherein the second line transmits a second clock signal; and a capacitor connected between the control terminal and the output terminal of the third transistor, wherein the first clock signal and the second clock signal signals have opposite phases.

6. A digital-to-analog converter (DAC) comprising:
a decoder unit receiving an external data signal;
a resistor array structured to generate a plurality of gray voltages; and
a voltage selecting unit structured to select one of the gray voltages based on an output of the decoder unit,
wherein the decoder unit comprises a plurality of digital decoders each having first and second boost circuits for generating digital outputs of boosted voltage level by using a power supply voltage of magnitude lower than the boosted voltage level.

7. The DAC of claim 6, wherein each decoder comprises first to third switching stages that are connected sequentially.

8. A digital-to-analog converter (DAC) comprising:
a decoder unit receiving an external data signal;
a resistor array structured to generate a plurality of gray voltages; and
a voltage selecting unit structured to select one of the gray voltages based on an output of the decoder unit,
wherein the decoder unit comprises a plurality of decoders each having first and second boost circuits for generating outputs of boosted voltage level by using a power supply voltage of magnitude lower than the boosted voltage level and wherein each decoder comprises first to third switching stages that are connected sequentially and further wherein the first boost circuit is positioned between the second and third stages.

9. The DAC of claim 8, wherein the first boost circuit comprises:

first to third transistors whose control terminals are commonly connected to the power supply voltage; and
a capacitor having one end connected to joined first source-!drains of the first and second transistors and the other end connected to a first source/drain of the third transistor.

10. The DAC of claim 9, wherein a second source/drain of the first transistor is connected to the power supply voltage and second source/drains of the second and third transistors are connected to each other, and the other end of the capacitor is connected to the second stage and a second source/drain of the third transistor is connected to the third stage.

11. The DAC of claim 10, wherein the first and third transistors are N-type MOS transistors and the second transistor is a P-type MOS transistor.

12. A digital-to-analog converter (DAC) comprising:
a decoder unit receiving an external data signal;
a resistor array structured to generate a plurality of gray voltages; and
a voltage selecting unit structured to select one of the gray voltages based on an output of the decoder unit,
wherein the decoder unit comprises a plurality of decoders each having first and second boost circuits for generating outputs of boosted voltage level by using a power supply voltage of magnitude lower than the boosted voltage level wherein each decoder comprises first to third switching stages that are connected sequentially and
wherein the second boost circuit generates an output based on first and second clock signals having opposite phases, and provides the generated output to the third stage.

13. The DAC of claim 12, wherein the second boost circuit comprises:

first and second transistors whose control terminals are commonly connected to the second clock signal;
a third transistor having a control terminal connected to an output terminal of the first transistor, an input terminal connected to the first clock signal, and an output terminal connected to the output terminal of the second transistor; and
a capacitor connected between the control terminal and the output terminal of the third transistor,
wherein the output terminal of the first transistor is connected to the third stage.

14. The DAC of claim 13, wherein the data signal comprises a plurality of bits, the first to third stages comprise at least a pair of switching units that are mutually connected, respectively, and one of the pair of switching units receives one of the plurality of bits and the other receives an inversion signal of the one bit.

15. The DAC of claim 14, wherein the switching units include two different transistors, respectively, and control terminals of the two transistors are connected to each other, output terminals of the two transistors are connected to each other, and input terminals of the two transistors are connected to first and second voltages, respectively.

16. The DAC of claim 15, wherein the first voltage is a ground voltage or an output voltage of a previous stage, and the second voltage is the power supply voltage.

17. The DAC of claim 16, wherein the number of switching units belonging to the second stage or the third stage is equal to the number of first boost circuits.

18. The DAC of claim 17, wherein the number of switching units belonging to the first stage is smaller than the number of switching units belonging to the second or third stage.

19. The DAC of claim 18, wherein the first stage comprises a pair of switching units, the second stage comprises two pairs of switching units, and one of the two pairs of the switching units of the second stage are connected to one switching unit of the first stage and the other of the two pairs of the switching units of the second stage are connected to the other remaining switching unit of the first stage.

20. A method for converting first digital signals operating in a first predefined voltage range into analog signals operating across a second predefined voltage range, the second predefined voltage range being substantially wider than the first predefined voltage range, the method comprising:
   decoding the first digital signals and producing therefrom second digital signals operating in the first predefined voltage range;
   converting the second digital signals into corresponding third digital signals operating in a third predefined voltage range, the third predefined voltage range being substantially wider than the first predefined voltage range, wherein said converting does not use a power supply voltage of a magnitude greater than a highest voltage in said first predefined voltage range; and
   selecting desired voltages from said second predefined voltage range for defining said analog signals, in response to the third digital signals.

21. The method of claim 20 wherein said step of converting the second digital signals into corresponding third digital signals operating in a third predefined voltage range includes charging a capacitor to a voltage defining a boost amount when the second digital signal is at a binary high level so as to thereby produce the third digital signal as a boosted output signal whose magnitude is a function of the sum of the boost amount and the binary high level of the second digital signal.

22. A method for driving a display device for converting external video data into an analog voltage, the method comprising:
   inputting the video data;
   shifting and latching the video data;
   decoding the shifted and latched video data; and
   selecting a voltage corresponding to the decoded video data and converting the selected voltage into the analog voltage,
   wherein the decoding the shifted and latched video data comprises:
   generating a first output;
   boosting the first output;
   generating a second output using a plurality of clock signals having a different phase; and
   outputting the second output or a grounded voltage depending on the first output as the selected voltage.

23. The method of claim 22, wherein the display device comprises a plurality of pixels and data lines connected thereto, and the method for driving the display device further comprises applying the analog voltage to the data lines.

* * * * *